(12) United States Patent
Lee et al.

(10) Patent No.: US 10,959,350 B2
(45) Date of Patent: *Mar. 23, 2021

(54) MOBILE TERMINAL

(71) Applicant: LG ELECTRONICS INC., Seoul (KR)

(72) Inventors: Yongho Lee, Seoul (KR); Youngmin Lee, Seoul (KR); Gihwan Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/897,236

(22) Filed: Jun. 9, 2020

(65) Prior Publication Data

US 2020/0383241 A1    Dec. 3, 2020

Related U.S. Application Data

(63) Continuation of application No. 16/349,841, filed as application No. PCT/KR2016/013354 on Nov. 18, 2016, now Pat. No. 10,721,837.

(51) Int. Cl.
*H04B 1/06* (2006.01)
*H05K 7/20* (2006.01)
(Continued)

(52) U.S. Cl.
CPC ...... *H05K 7/20336* (2013.01); *H04M 1/0262* (2013.01); *H04M 1/0266* (2013.01);
(Continued)

(58) Field of Classification Search
CPC .......... H05K 7/20336; H05K 7/20327; H05K 9/0024; H05K 7/2099; H05K 7/20963;
(Continued)

(56) References Cited

U.S. PATENT DOCUMENTS 9,307,682 B2 *  4/2016  Fujieda ............... F28D 15/0233
9,639,148 B2 *  5/2017  Kato ........................ G06F 3/01
(Continued)

FOREIGN PATENT DOCUMENTS

EP          3068202         9/2016
KR      1020140000933      1/2014
(Continued)

OTHER PUBLICATIONS

U.S. Appl. No. 16/349,841, Office Action dated Dec. 6, 2019, 13 pages.
(Continued)

*Primary Examiner* — Tuan Pham
(74) *Attorney, Agent, or Firm* — Lee, Hong, Degerman, Kang & Waimey

(57) ABSTRACT

Disclosed is a mobile terminal which can improve serviceability by increasing heat dissipation efficiency, the mobile terminal comprising: a case comprising an inner space, and a metal partition partitioning same; a battery located on one side of the inner space with respect to the partition; a main substrate which is located on the other side of the inner space with respect to the partition, and on which a heat-generating part is mounted; and a heat pipe comprising a heat-absorbing part in contact with the heat-generating part, and a heat transfer part arranged adjacent to the partition and extending along same.

4 Claims, 12 Drawing Sheets

(51) Int. Cl.
  *H04M 1/02*   (2006.01)
  *H05K 9/00*   (2006.01)
(52) U.S. Cl.
  CPC ....... *H05K 7/20327* (2013.01); *H05K 9/0024* (2013.01); *H04M 2250/12* (2013.01)
(58) Field of Classification Search
  CPC ... H04M 1/0262; H04M 1/0226; G06F 1/203; G06F 1/20
  See application file for complete search history.

(56) References Cited

U.S. PATENT DOCUMENTS

| | | | |
|---|---|---|---|
| 10,219,410 B2* | 2/2019 | Zhang | H05K 9/006 |
| 10,721,837 B2* | 7/2020 | Lee | H05K 9/0024 |
| 2013/0222298 A1 | 8/2013 | Kato et al. | |
| 2014/0321058 A1 | 10/2014 | Fujieda et al. | |
| 2015/0155614 A1 | 6/2015 | Youn et al. | |
| 2020/0060043 A1 | 2/2020 | Lee et al. | |

FOREIGN PATENT DOCUMENTS

| | | |
|---|---|---|
| KR | 1020160009914 | 1/2016 |
| KR | 1020160096927 | 8/2016 |
| WO | 2015133201 | 9/2015 |

OTHER PUBLICATIONS

European Patent Office Application Serial No. 16921910.2, Search Report dated May 27, 2020, 10 pages.
PCT International Application No. PCT/KR2016/013354, Written Opinion of the International Searching Authority dated Aug. 18, 2017, 17 pages.
Korean Intellectual Property Office Application No. 10-2019-7011302, Office Action dated Apr. 28, 2020, 3 pages.

* cited by examiner

MOBILE TERMINAL

CROSS-REFERENCE TO RELATED APPLICATIONS

This application is a continuation of U.S. patent application Ser. No. 16/349,841, filed on May 14, 2019, now U.S. Pat. No. 10,721,837, which is a National Stage filing under 35 U.S.C. 371 of International Application No. PCT/KR2016/013354, filed on Nov. 18, 2016, the contents of which are all incorporated by reference herein in their entirety.

TECHNICAL FIELD

The present invention relates to a mobile terminal improving heat dissipation performance.

BACKGROUND ART

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some terminals include additional functionality which supports game playing, while other terminals are configured as multimedia players. More recently, mobile terminals have been configured to receive multicast signals which permit viewing of contents such as broadcasts, videos and television programs.

Such terminals perform various functions such as capturing images and video, playing music or video files, game playing, receiving broadcasts and the like by being configured as multimedia players.

As functions of a mobile terminal are complicated and diversified, a time for using the mobile terminal increases and an information amount processed by a main chip (Application Processor (AP)) of the mobile terminal increases as well. There is a growing need for a heat dissipation structure of discharging heat generated from a main chip to enhance usability and durability of a mobile terminal.

DISCLOSURE OF THE INVENTION

Technical Task

One technical task of the present invention is to provide a mobile terminal that improves a heat dissipation function.

Technical Solutions

In one technical aspect of the present invention, provided herein is a mobile terminal, including a case including an internal space and a partition partitioning the internal space and formed of a metallic material, a battery located on one side of the internal space with reference to the partition, a main board located on the other side of the internal space with reference to the partition and having a heating component mounted thereon, and a heat pipe including a heat absorbing portion contacting with the heating component and a heat transfer portion disposed adjacent to the partition and extending along the partition.

A conductive tape inserted between the partition and the heat transfer portion of the heat pipe may be further included.

A heat diffusing sheet inserted between the heating component and the heat absorbing portion of the heat pipe may be further included.

The heat pipe includes a member of a film type, the heat absorbing portion may be disposed on a front side and a backside of the mobile terminal side by side, and the heat transfer portion may be disposed side by side with a lateral side of the partition.

The mobile terminal may further include a display unit mounted on a front side of the case and a display frame formed of a metallic material and coupled to a backside of the display unit, one side of the heat absorbing portion may come in contact with the heating component, and the other side of the heat absorbing portion may come in contact with the display frame.

The case may include a rear case formed of a metallic material and coupled to the partition and may further include an uneven portion formed within the rear case.

The mobile terminal may further include a sound hole formed in the case, an audio output unit located inside the sound hole, and a heat diffusing portion disposed within the case by being adjacent to the sound hole and contacting with the heat transfer portion of the heat pipe.

The mobile terminal may further include an insulating portion inserted between the heat transfer portion of the heat pipe and the partition.

The insulating portion may include a plurality of rings put on the heat transfer portion.

The mobile terminal may include first and second holes formed in the case and a micro pump forming a flow of air so that the air of the first hole is sucked and then escapes through the second hole, and the heat pipe may be located on an air flow path by the micro pump.

The mobile terminal may further include a temperature sensor measuring a temperature within the case and a controller activating the micro pump if a temperature equal to or higher than a reference temperature is sensed by the temperature sensor.

In another technical aspect of the present invention, provided herein is a mobile terminal, including a case including an internal space and a lateral metal case, a display unit mounted on a front side of the case, a main board located in the internal space and having a heating component mounted thereon, a heat pipe including a heat absorbing portion contacting with the heating component and a heat transfer portion extending in a length direction of the case, a display frame located on a backside of the display unit and contacting with the heat pipe, and a shield slit formed on the display frame and extending in a top-bottom direction between the lateral metal case and the heat pipe.

The mobile terminal may further include a battery installed in the internal space, the heat transfer portion of the heat pipe may be located between the battery and the lateral metal case, and a distance between the battery and the heat transfer portion of the heat pipe may be shorter than a distance between the lateral metal case and the heat transfer portion of the heat pipe.

The shield slit may further include a first slit and a second slit formed at a location spaced apart from both end portions of the first slit in a direction of the metal case.

Advantageous Effects

Durability of a mobile terminal according to the present invention can be improved by enhancing heat dissipation performance of the mobile terminal.

Part increase can be minimized by utilizing a metal structure of a mobile terminal as much as possible without sparing a space for a heat dissipation member additionally.

Use inconvenience due to heat generated from a mobile terminal in use can be reduced by preventing heat from being transferred to a lateral side of the mobile terminal most frequently touched by a hand of a user in case of using the mobile terminal.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BEST MODE FOR INVENTION

Figure 1A:
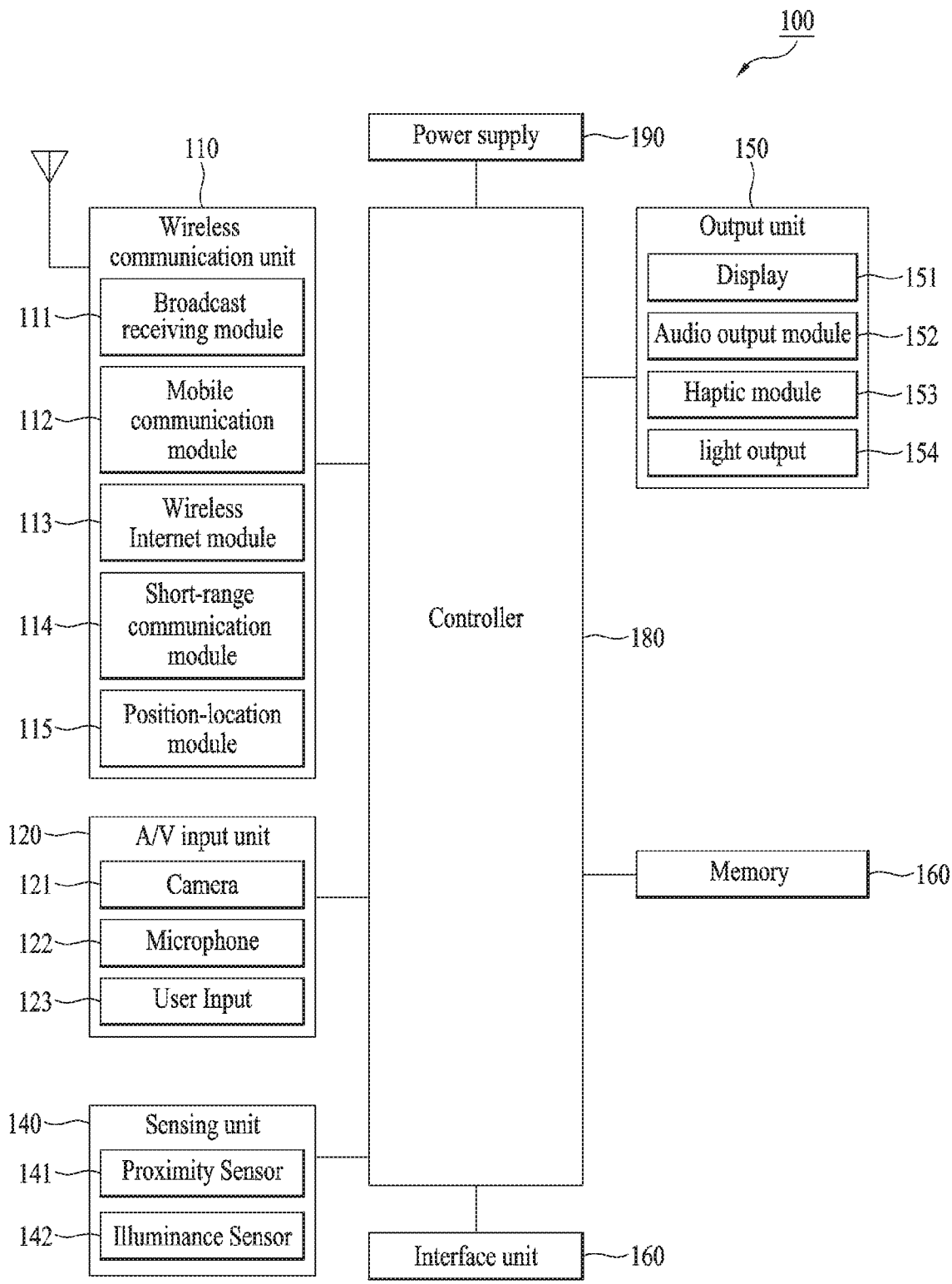
FIG. 1A is a block diagram to describe a mobile terminal related to the present invention.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
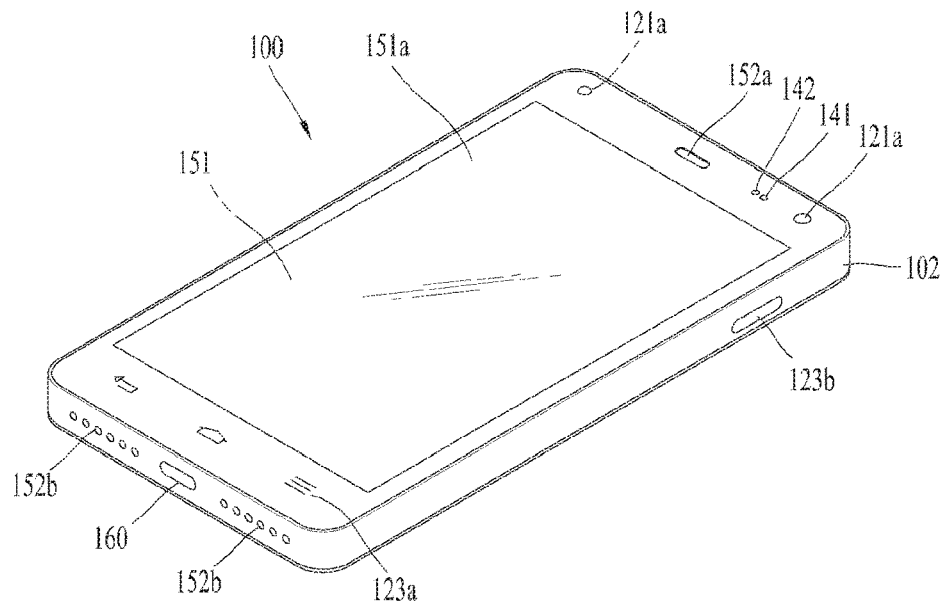
FIG. 1B and FIG. 1C are conceptual diagrams for one example of a mobile terminal related to the present invention, viewed in different directions.
Figure 1C:
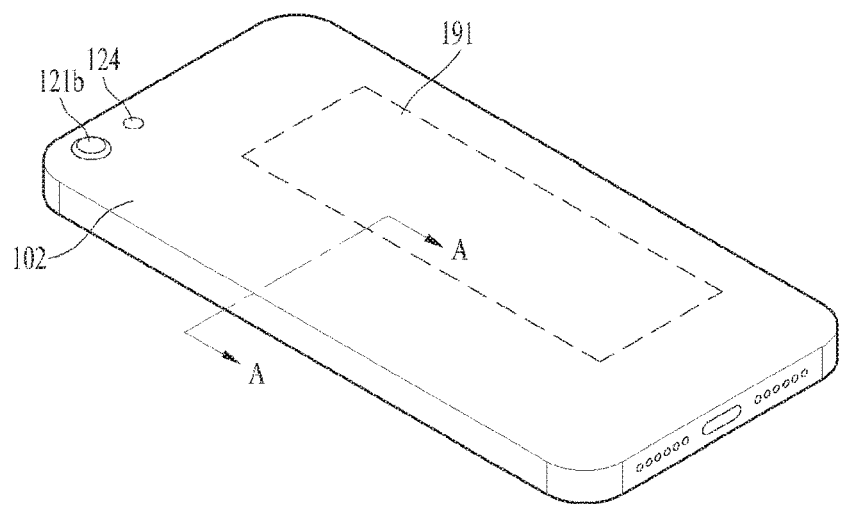

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components in The FIG. 1A is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Hereinafter, referring to FIG. 1, the components mentioned above will be described in detail before describing the various embodiments which are realized by the mobile terminal 100 in accordance with the present disclosure.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000(Code Division Multi Access 2000), EV-DO(Enhanced Voice-Data Optimized or Enhanced Voice-Data Only), Wideband CDMA (WCDMA), High Speed Downlink Packet access (HSDPA), HSUPA(High Speed Uplink Packet Access), Long Term Evolution (LTE), LTE-A(Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA(High Speed Uplink Packet Access), Long Term Evolution (LTE), LTE-A(Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

In some embodiments, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal. As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module. If desired, the location information module 115 may alternatively or additionally function with any of the other modules of the wireless communication unit 110 to obtain data related to the position of the mobile terminal. The location information module 115 is a module used to obtain the location (or current location) of the mobile terminal, and is not limited to a module that directly calculates or obtains the location of the mobile terminal.

The input unit 120 may be configured to permit various types of input to the mobile terminal 120. Examples of such input include audio, image, video, data, and user input. Image and video input is often obtained using one or more cameras 121. Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like. The controller 180 generally cooperates with the sensing unit 140 to control operation of the mobile terminal 100 or execute data processing, a function or an operation associated with an application program installed in the mobile terminal based on the sensing provided by the sensing unit 140. The sensing unit 140 may be implemented using any of a variety of sensors, some of which will now be described in more detail.

The proximity sensor 141 may include a sensor to sense presence or absence of an object approaching a surface, or an object located near a surface, by using an electromagnetic field, infrared rays, or the like without a mechanical contact. The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like). In general, controller 180 processes data corresponding to proximity touches and proximity touch patterns sensed by the proximity sensor 141, and cause output of visual information on the touch screen. In addition, the controller 180 can control the mobile terminal 100 to execute different operations or process different data according to whether a touch with respect to a point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

In some embodiments, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

In some embodiments, the display unit 151 may be implemented as a stereoscopic display unit for displaying stereoscopic images.

A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal there through. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a Flash memory, a hard disk, a solid state disk, a silicon disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control the general operations of the mobile terminal 100. For example, the controller 180 may set or release a lock state for restricting a user from inputting a control command with respect to applications when a status of the mobile terminal meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 may be provided with the power supplied by an external power source and the power supplied therein under the control of the controller 180 so as to supply the needed power to each of the components. The power supply unit 190 may include a battery. The battery may be a built-in type which is rechargeable and detachably loaded in the terminal to be charged.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Referring now to FIGS. 1B and 1C, the mobile terminal 100 is described with reference to a bar-type terminal body. However, the mobile terminal 100 may alternatively be implemented in any of a variety of different configurations.

Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

Here, the terminal body may be understood to refer to the concept of this bore a mobile terminal (100) to at least one of the aggregate.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include the display unit 151, the audio output module, the proximity sensor 141, the illuminance sensor 142, the optical output module 154, the camera 121, the user input unit 123, the microphone 122 and the interface unit 160.

It will be described for the mobile terminal as shown in FIGS. 1B and 1C. The display unit 151, the first audio output module 152a, the proximity sensor 141, an illumination sensor 142, the optical output module 154, the first camera 121a and the first manipulation unit 123a are arranged in front surface of the terminal body, the second manipulation unit 123b, the microphone 122 and interface unit 160 are arranged in side surface of the terminal body, and the second audio output modules 152b and the second camera 121b are arranged in rear surface of the terminal body.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151*a* and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121*a* can process image frames such as still or moving images obtained by the image sensor in a capture mode or a video call mode. The processed image frames can then be displayed on the display unit 151 or stored in the memory 170.

The first and second manipulation units 123*a* and 123*b* are examples of the user input unit 123, which may be manipulated by a user to provide input to the mobile terminal 100. The first and second manipulation units 123*a* and 123*b* may also be commonly referred to as a manipulating portion, and may employ any tactile method that allows the user to perform manipulation such as touch, push, scroll, or the like. The first and second manipulation units 123*a* and 123*b* may also employ any non-tactile method that allows the user to perform manipulation such as proximity touch, hovering, or the like.

FIG. 1B illustrates the first manipulation unit 123*a* as a touch key, but possible alternatives include a mechanical key, a push key, a touch key, and combinations thereof.

Input received at the first and second manipulation units 123*a* and 123*b* may be used in various ways. For example, the first manipulation unit 123*a* may be used by the user to provide an input to a menu, home key, cancel, search, or the like, and the second manipulation unit 123*b* may be used by the user to provide an input to control a volume level being output from the first or second audio output modules 152*a* or 152*b*, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152*a* or 152*b*, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123*a* in the rear input unit. As such, in situations where the first manipulation unit 123*a* is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121*b* is shown located at the rear side of the terminal body and includes an image capturing direction that is substantially opposite to the image capturing direction of the first camera unit 121*a*. If desired, second camera 121*a* may alternatively be located at other locations, or made to be moveable, in order to have a different image capturing direction from that which is shown.

The second camera 121*b* can include a plurality of lenses arranged along at least one line. The plurality of lenses may also be arranged in a matrix configuration. The cameras may be referred to as an "array camera." When the second camera 121*b* is implemented as an array camera, images may be captured in various manners using the plurality of lenses and images with better qualities.

A flash 124 is shown located adjacent to the second camera 121*b*. When an image of a subject is captured with the camera 121*b*, the flash 124 may illuminate the subject.

The second audio output module 152*b* can be located on the terminal body. The second audio output module 152*b* may implement stereophonic sound functions in conjunction with the first audio output module 152*a*, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 (see FIG. 1A). may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

Figure 2:
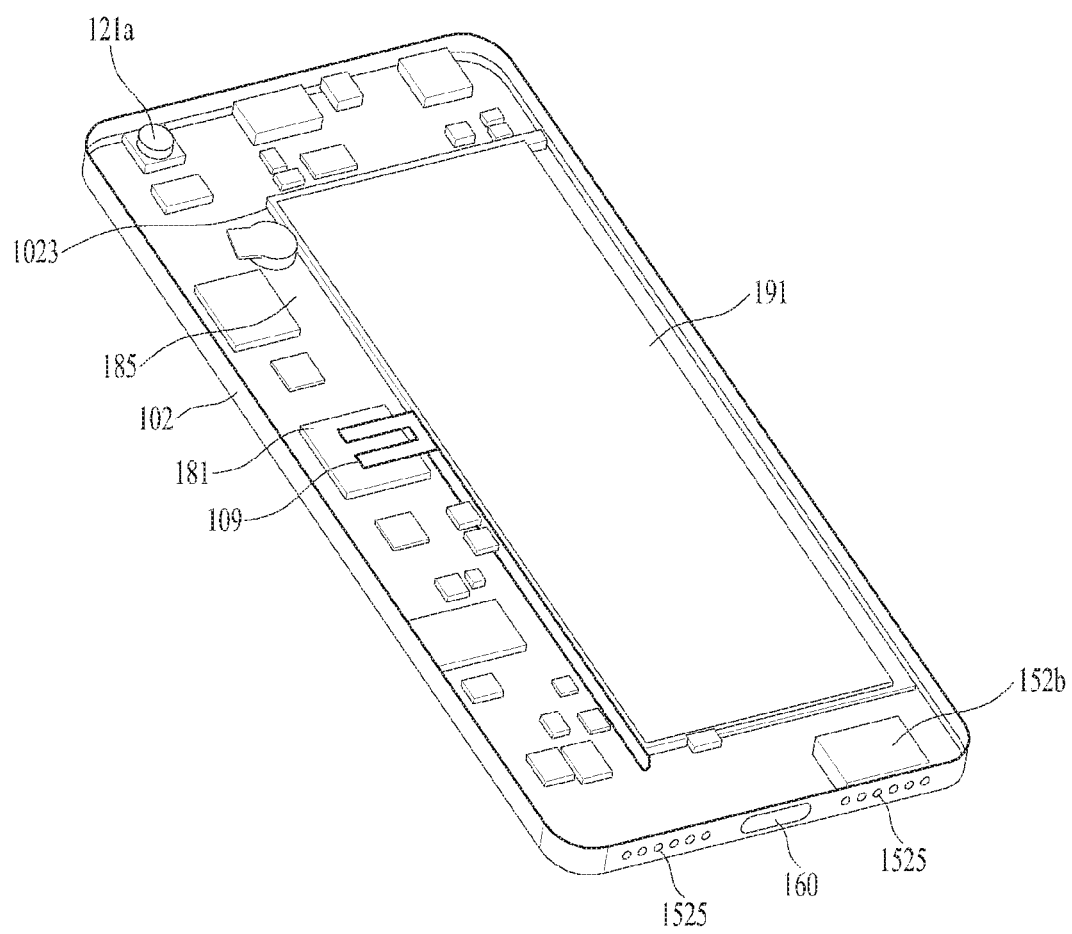
FIG. 2 is a diagram showing one example of a state that a front display unit of a mobile terminal related to the present invention is separated.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen FIG. 2 is a diagram showing one example of a state that a front display unit 151 and a window 151a of a mobile terminal 100 related to the present invention are separated. A body of a mobile terminal 100 of the present invention includes an internal space in which various components such as a main board 185, a battery 191 and the like are installed and a partition 1023 for partitioning the internal space. The body of the mobile terminal 100 may include a metal plate made of a metallic material for rigidity. The metal plate may be located within the body or disposed in a manner that at least one portion is exposed externally. As a representative example of the metal plate, there is a rear case 102 located on a backside of the body or a display frame 106 located on a backside of the display unit 151.

The rear case 102 of the embodiment shown in FIG. 2 includes a metallic material and the metal plate of the present embodiment configures the rear case 102.

The main board 185 in which components such as the battery 191, the camera 121, the audio output unit 152 and the like and a heating component 181 such as a main chip (e.g., Application Processor (AP)) controlling the above components are installed is disposed in an internal space formed between the rear case 102 and a front window.

The partition 1023 separates a space for installing the battery 191 therein and a space for installing components such as the main board 185 and the like from each other and fixes the battery 191 thereto by enclosing the battery 191. The main board 185 and the like are located in a first space located on one side of the partition 1023, and the battery 191 is seated in a second space located on the other side of the partition 1023. If so, as a terminal of the battery 191 and a power terminal 186 of the main board 185 are connected to each other through the partition 1023, whereby power is supplied to the various components including the main board 185 and the battery 191 can be charged with the power supplied through the interface unit 160.

Since the heating component 181 mounted on the main board 185 generates most of heat within the mobile terminal 100, it is necessary to disperse the heat generated from the heating component 181. The rear case 102 of the mobile terminal 100 according to the present embodiment includes the metallic material. As heat conductivity of metal is high, it is able to disperse the heat generated from the heating component 181 using the metal of the rear case 102 made of the metallic material.

In case that the heating component 181 is disposed toward the rear case 102 of the mobile terminal 100, a heat dissipation sheet is disposed between the heating component 181 and the rear case 102 so that heat can be transferred to the rear case 102. Yet, since the heating component 181 of the present embodiment faces an opposite direction of the rear case 102, the heat generated from the heating component 181 can be transferred to the rear case 102 through the partition 1023 using a heat pipe 109.

The heat pipe 109 is formed of a material (e.g., Cu, graphite, etc.) having high heat conductivity, and includes a heat absorbing portion 109a contacting with the heating component 181 and a heat transfer portion 109b extending along the partition 1023. The heart absorbing portion 109a absorbs heat and the heat transfer portion 109b plays a role in transmitting heat to the rear case 102. As the partition 1023 is projected from the rear case 102 in a front direction, it may come in contact with the heat transfer portion 109b.

Although right and left sidewalls of the rear case 102 are projected in the front direction, the sidewalls of the rear case 102 are the side parts of the mobile terminal 100 directly held with a hand by a user when the mobile terminal 100 is used. Therefore, as it is preferable that heat is not dispersed toward the sidewall of the rear case 102 as far as possible, the heat transfer portion 109b of the heat pipe 109 comes in contact with the partition 1023 projected between the battery 191 and the main board 185, spaced apart from the right and left lateral sides of the mobile terminal 100.

Figure 3:
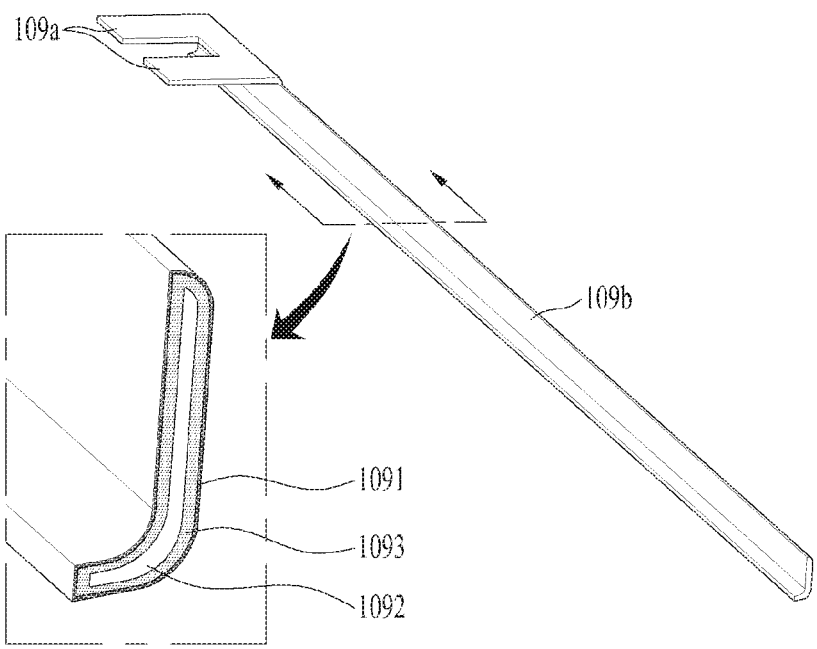
FIG. 3 is a diagram showing one example of a heat pipe of a mobile terminal related to the present invention.
Figure 4:
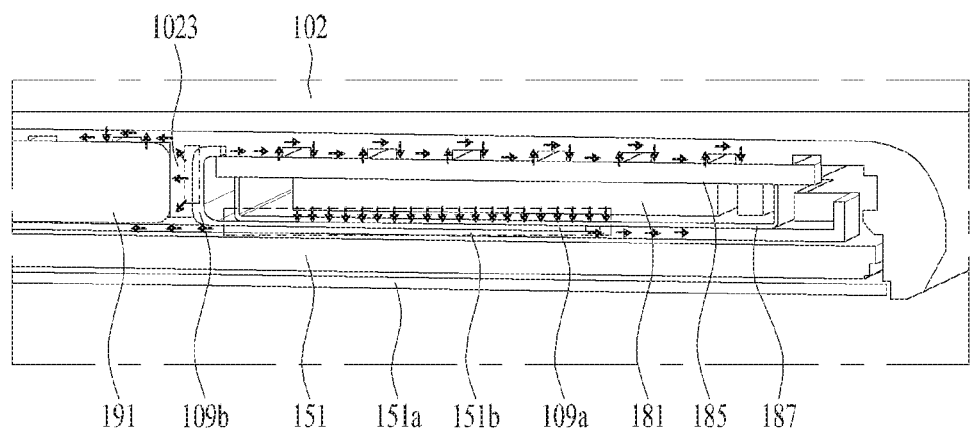
FIG. 4 is a diagram showing a cross-section A-A of FIG. 1C.

FIG. 3 is a diagram showing one example of the heat pipe 109 of the mobile terminal 100 related to the present invention, and FIG. 4 is a diagram showing a cross-section A-A of FIG. 1C. As the heat absorbing portion 109a contacts with a topside of the heating component 181, a direction faced by a surface of the heat absorbing portion 109a is arranged side by side with a front side or backside of the mobile terminal 100 and the heat transfer portion 109b is disposed side by side with the partition 1023 projected in a vertical direction from the backside of the mobile terminal 100. Hence, the heat absorbing portion 109a and the heat transfer portion 109 face different surfaces, respectively.

In order to expand the surface contacting with the heating component 181, a plurality of the heat absorbing portions 109a may be configured as shown in FIG. 3 or the heat absorbing portion 109a may be configured in a wide panel shape.

The heat transfer portion 109b of the heat pipe 109 includes a pipe member 1091 containing a space (i.e., flow path) extending to one side therein, a first flow path 1092 formed within the pipe member 1091, a second flow path 1093 formed on an inner wall of the pipe member 1091, and a working fluid.

The pipe member 1091 uses a material having high heat conductivity like copper, and the working fluid moves along the fluid paths 1092 and 1093 formed in the pipe member 1091. As the working fluid is transformed into a gas at the temperature equal to or higher than the boiling point or a liquid at the temperature lower than the boiling point, it can employ a solution having a boiling point equal to or lower than the maximum increasing temperature of the heating component 181.

If the heating component 181 is heated over a prescribed temperature, the working fluid is vaporized by the heat absorbed in the heat absorbing portion 109a and discharges heat while moving through the heat transfer portion 109b. If the working fluid cools down to the temperature lower than the boiling point, it turns into a liquid state. In this case, in order to separate a flow of the working fluid in the liquid state from that of the working fluid in the gas state, the flow path can be separated into the first flow path 1092 and the second flow path 1093. The first flow path 1092 and the second flow path 1092 can be physically cut off by being separated from each other. Yet, since a size of the heat pipe 109 installed in such a small-sized product as a mobile terminal is very small, a finely-structured fluid path is implemented.

The first fluid path 1092 may be located in a central part of the pipe member 1091 and the second fluid path 1093 may be disposed on an inner circumference of the pipe member 1091 while enclosing the first fluid path 1092. The second fluid path 1093 is implemented into a mesh structure or a capillary configuration, whereby a working fluid of a liquid type can move along small gaps of the mesh structure or capillary using surface tension.

If the working fluid in the gas state is liquefied in the first fluid path 1092, it moves toward the heat absorbing portion 109a along the second fluid path 1093. If the working fluid in the liquid state evaporates by absorbing heat, it moves along the first fluid path 1092.

As shown in FIG. 4, a shield can 187 joined to the main board 185 by covering the topside of the heating component 181 may be further included to protect the heating component 181. The shield can 187 is made of metallic material such as aluminum, and may be mounted on the main board 185 by enclosing the heating component 181 in form of a cap to block the shock applied to the heating component 181 and prevent function degradation due to static electricity or electromagnetic waves. Thus, in case that the shield can 187 is included, the heat absorbing portion 109a of the heat pipe 109 is disposed on the shield can 187.

Referring to FIG. 4, the heat generated from the heating component 181 is transferred to the heat transfer portion 109b through the heat absorbing unit 109a of the heat pipe 109, and the heat transfer portion 109b transfers the heat to the partition 1023. The heat transferred to the partition 1023 is dispersed in a manner of being transferred along the backside of the rear case 102 of the metallic material. An uneven surface may be formed on the rear case 102 to enable thermal diffusion through the rear case 102 more efficiently.

A display frame 151b may be further included to support a backside of the display unit 151. The display frame 151b may be integrally formed with the display unit 151 to protect the backside of the display unit 151. The display frame 151b may include a metallic material for rigidity, and the heat absorbing portion 109a of the heat pipe 109 can diffuse heat through the display frame 151b as well by transferring the heat to the display frame 151b.

Figure 5:
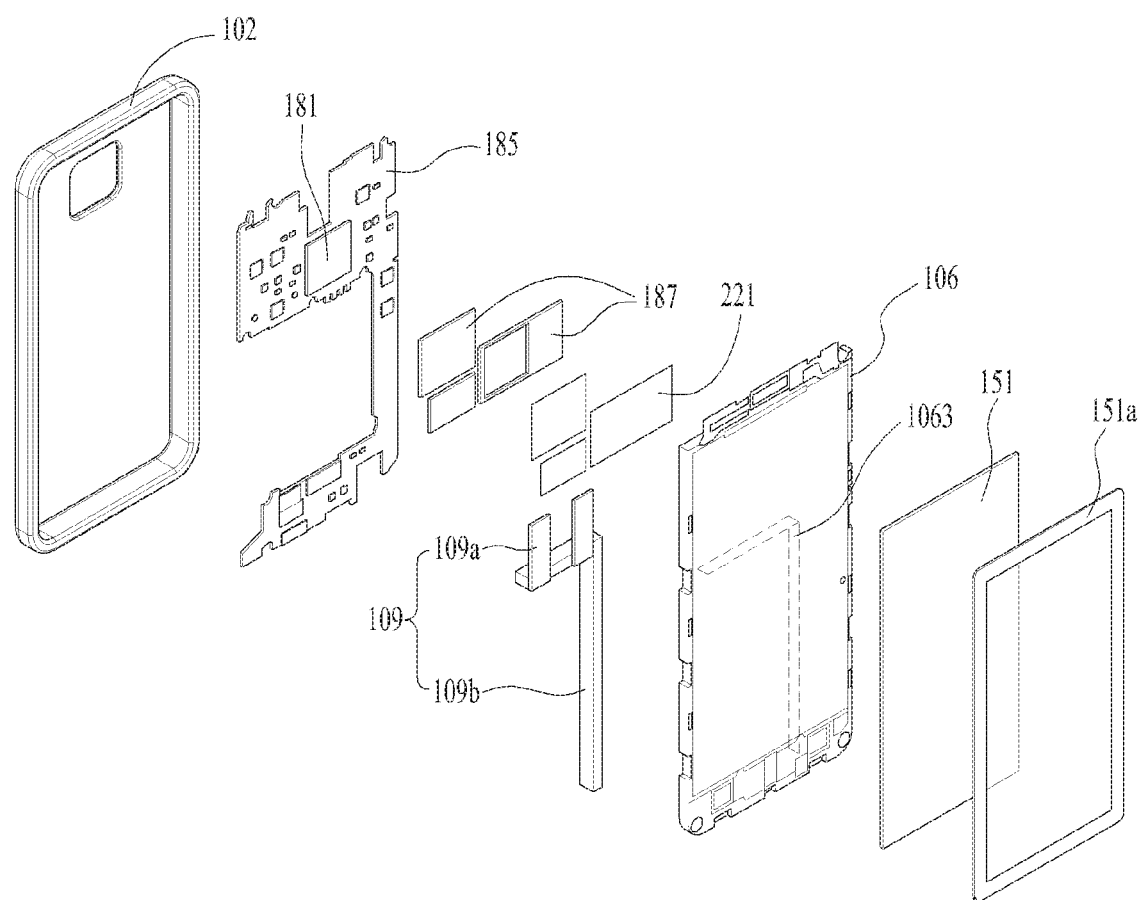
FIG. 5 is a diagram showing another example of a heat pipe of a mobile terminal related to the present invention.

FIG. 5 is a diagram showing another example of a heat pipe 109 of a mobile terminal related to the present invention. Unlike the aforementioned embodiment, a partition 1063 of the present embodiment may be formed on a display frame 106 located on a backside of the display unit 151. The display frame 106 supports the display unit 151 on the backside of the display unit 151 and provides the overall rigidity of the mobile terminal 100.

Figure 6:
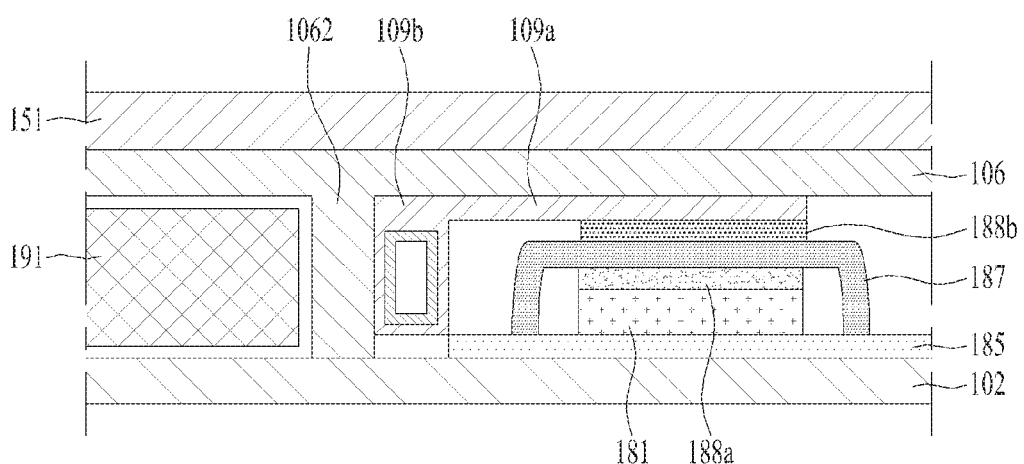
FIG. 6 is a cross-sectional diagram to describe a stacked structure of a heat pipe and a heating component of a mobile terminal related to the present invention.

FIG. 6 is a cross-sectional diagram to describe a stacked structure of a heat pipe 109 and a heating component 181 of a mobile terminal 100 related to the present invention. The heating component 181 of the present embodiment includes a shield can. If there is a gap between the shield can 187 and the heating component 181, since a speed for the heat of the heating component 181 to be transferred to the shield can 187 is slow, a first heat transfer member 188a located between the heating component 181 and the shield can 187 may be further included. The first heat transfer member 188a may have elasticity so as not to apply a pressure to the heating component 181 and include a material of high heat conductivity.

Figure 7:
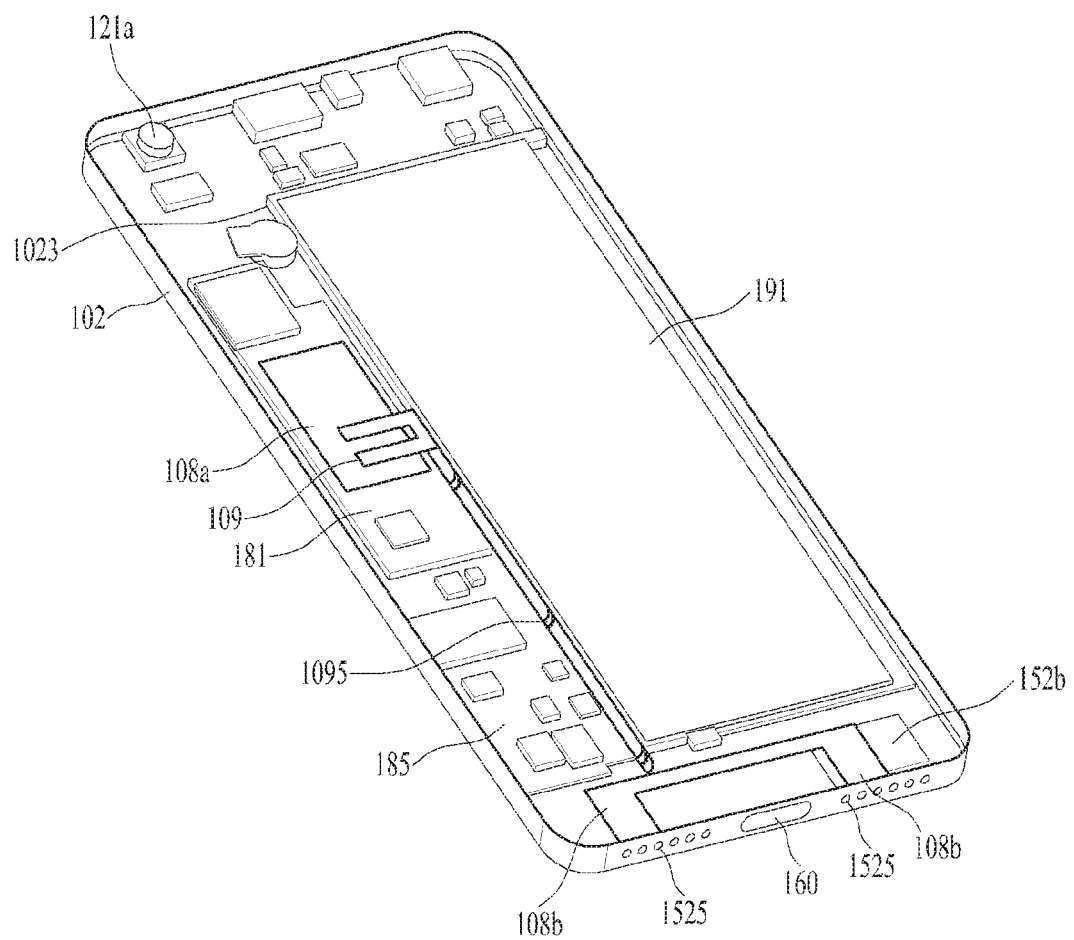
FIG. 7 is a diagram showing another example of a state that a front display unit of a mobile terminal related to the present invention is separated.

In order to maintain a state that the shield can 187 and a heat absorbing portion 109a of the heat pipe 109 are fastened closely to each other, a second heat transfer member 188b may be inserted between the shield can 187 and the heat absorbing portion 109a. The second heat transfer member 188b may use a heat conductive member of a double-sided tape, which contains an adhesive material, so as to maintain the fastened state between the shield can 187 and the heat absorbing portion 109a. FIG. 7 is a diagram showing another example of a state that a front display unit 151 of a mobile terminal 100 related to the present invention is separated. Although the embodiment of FIG. 5 is similar to the aforementioned embodiment in using the heat pipe 109 including the heat absorbing portion 109a and the heat transfer portion 109b, heat is discharged using a sound hole 1525 located in a bottom side of the mobile terminal 100 instead of using the rear case 102.

The sound hole 1525 is an opening formed in the case 101 and 102 so as to output sound and communicates with the open air. Although a waterproof structure (e.g., Gore-tex) capable of allowing air to pass through only while preventing water from passing through is provided, since air can pass through unlike a waterproof packing formed of an elastic member, heat can be discharged through the sound hole 1525.

The heat pipe 109 of the present invention transfers the heat generated from the heating component 181 to the sound hole 1525 located at the bottom end of the mobile terminal 100, and an end portion of the heat transfer portion 109b may include a heat diffusing portion 108b. The heat diffusing portion 108b uses a material (e.g., copper, graphite, etc.) of high thermal conductivity and enable heat to escape through the sound hole 1525 in a manner that the heat diffuses by enlarging a surface area.

Figure 8:
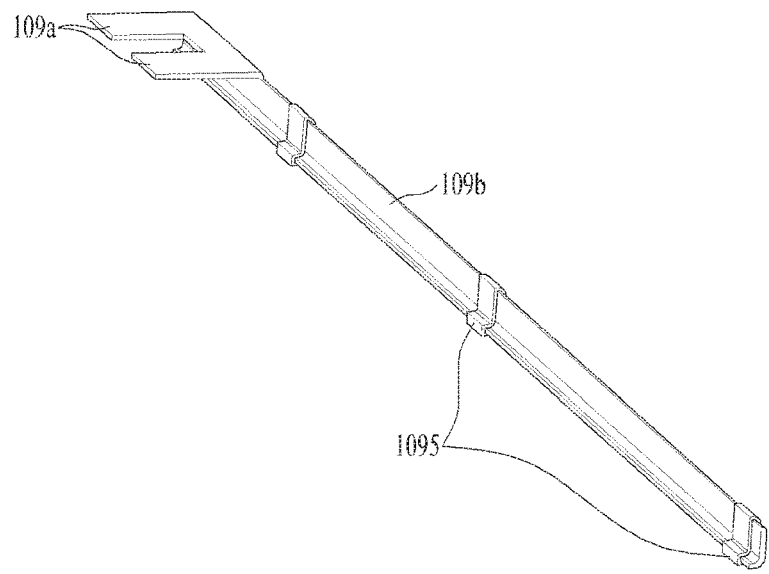
FIG. 8 is a diagram showing further example of a heat pipe of a mobile terminal related to the present invention.
Figure 9:
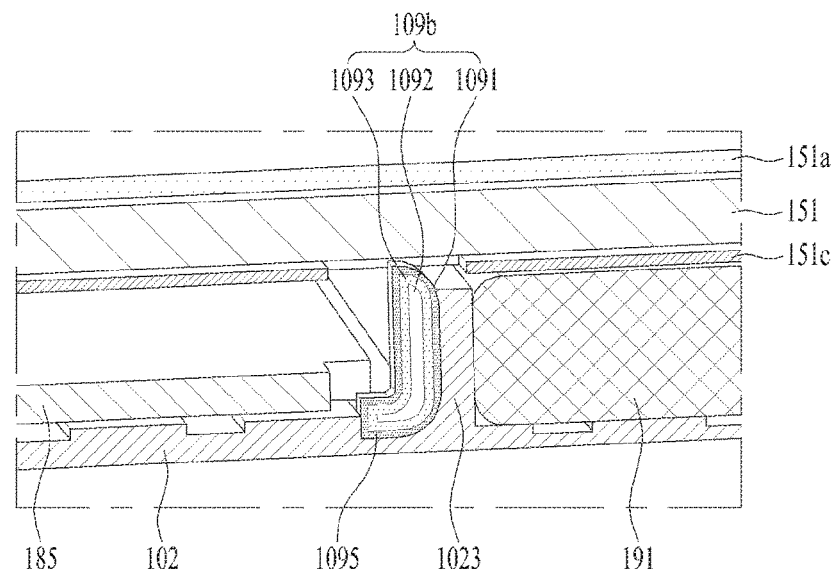
FIG. 9 is a diagram showing a cross-section of a mobile terminal related to the embodiment of FIG. 7.

In order to transfer the heat from the heating component 181 to the heat pipe 109 more effectively, a conductive tape 108a may be inserted between the heating component 181 and the heat absorbing portion 109a of the heat pipe 109. FIG. 8 is a diagram showing further example of a heat pipe 109 of a mobile terminal 100 related to the present invention. FIG. 9 is a diagram showing a cross-section of the mobile terminal 100 related to the embodiment of FIG. 7.

The object of the heat pipe 109 of the present embodiment is to transfer heat to the heat diffusing portion 108b located at the end portion of the heat transfer portion 109b. Therefore, in order to prevent heat from escaping through the rear case 102 and prevent heat from being transferred to a battery 191 and a main board 185, an insulating portion 1095 may be included.

The insulating portion 1095 may be disposed between a partition 1023 and a heat transfer portion 109b of the heat pipe 109 or between the main board 185 and the heat pipe 109. Alternatively, the insulating portion 1095 may be implemented as a ring put on the heat pipe 109 as shown in FIG. 8. The ring may cover the entire heat transfer portion 109b of the heat pipe 109, or a plurality of rings may be combined so as to spread a gap between the partition 1023 and the heat transfer portion 109b of the heat pipe 109.

Figure 10:
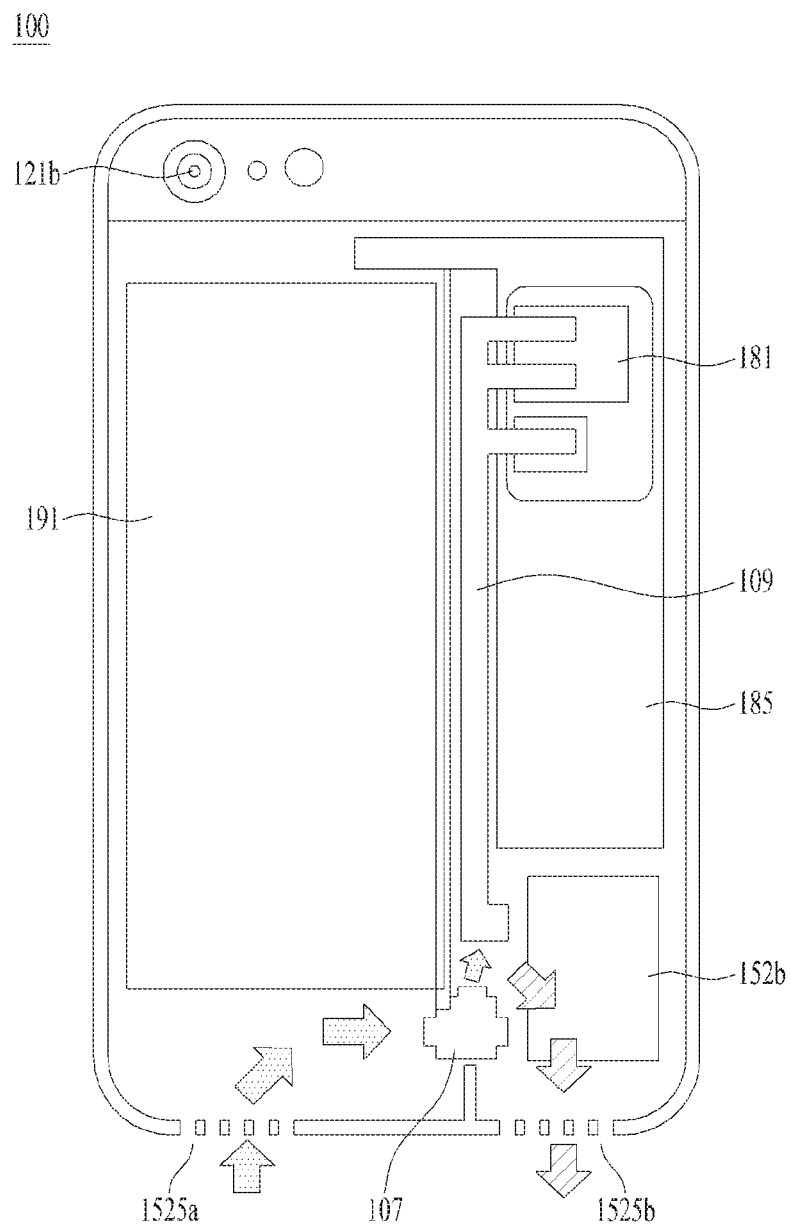
FIG. 10 is a conceptional diagram of a mobile terminal related to the present invention.

FIG. 10 is a conceptional diagram of a mobile terminal 100 related to the present invention. The mobile terminal 100 of the present embodiment includes two sound holes 1525. In order to facilitate heat to escape to the sound hole 1525 from a second end portion of a heat pipe 109, a micro pump 107 can be used. The micro pump 107 can control air to flow in through one sound hole 1525 (on the left in the drawing) and flow out through the other sound hole 1525 (on the right in the drawing).

Figure 11:
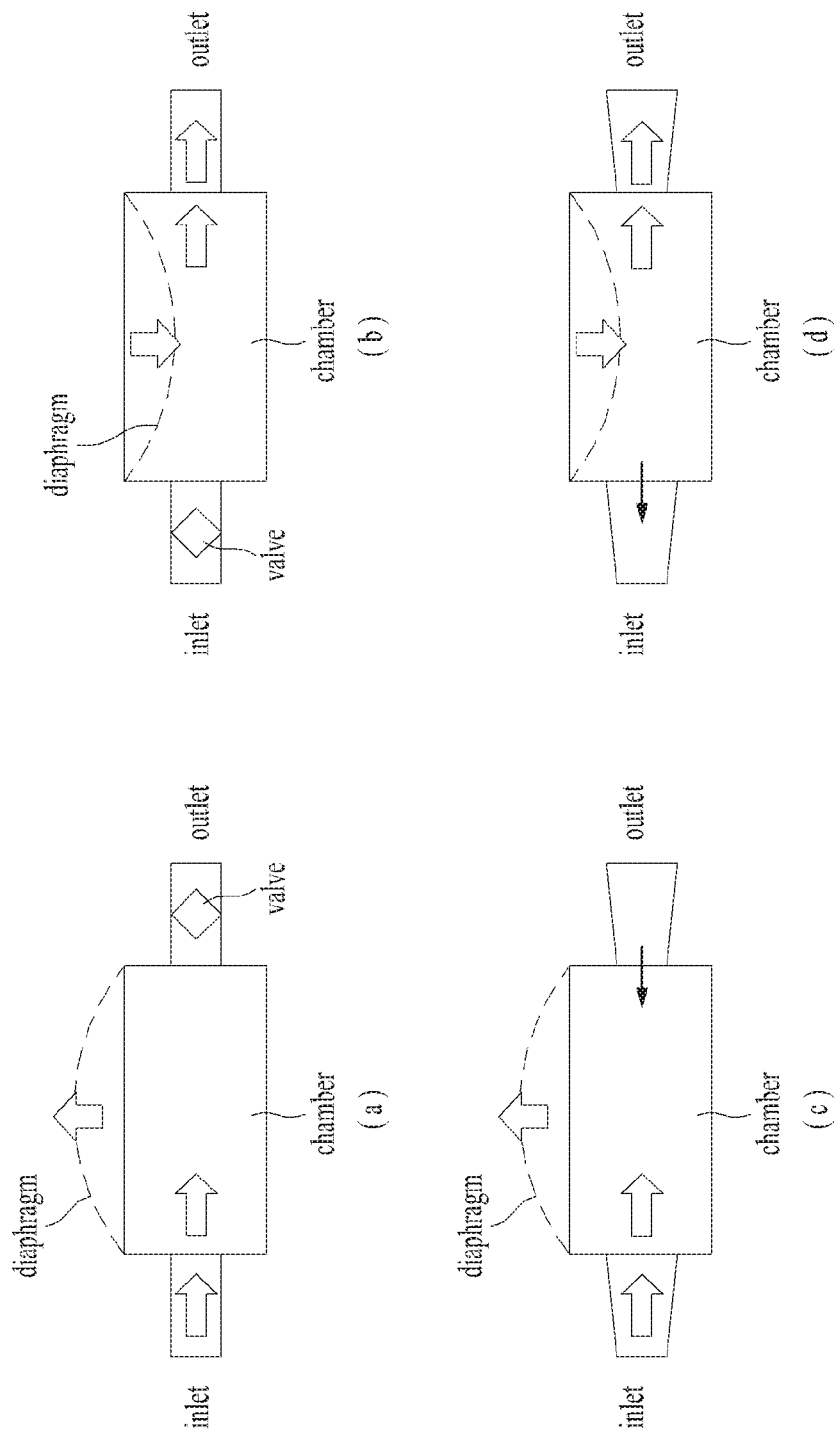
FIG. 11 is a diagram to describe the concept of a micro pump of FIG. 10.

FIG. 11 is a diagram to describe the concept of the micro pump 107 of FIG. 10. A flow of air can be controlled in a manner of enlarging or reducing an internal space of the micro pump 107 using a diaphragm.

In case that a valve is included in an inlet or outlet as shown in (a) or (b), when the inner space of the micro pump 107 is enlarged, the valve of the outlet is closed so as to enable air to flow into the micro pump 107 through the inlet. When the inner space of the micro pump 107 is reduced, the valve of the inlet is closed so as to enable air in the micro pump 107 to flow out through the outlet.

As shown in (c) or (d), by differentiating shapes of the inlet and outlet, it is able to control a flow of air to be performed in one direction. And, it is able to induce air to flow from the inlet to the outlet using the inlet and outlet shaped in a manner of becoming wider in an air flowing direction.

A heat diffusing portion 108b (not shown in FIG. 10) provided to a bottom end of the heat transfer portion 109b may be further included as shown in FIG. 5.

Figure 12:
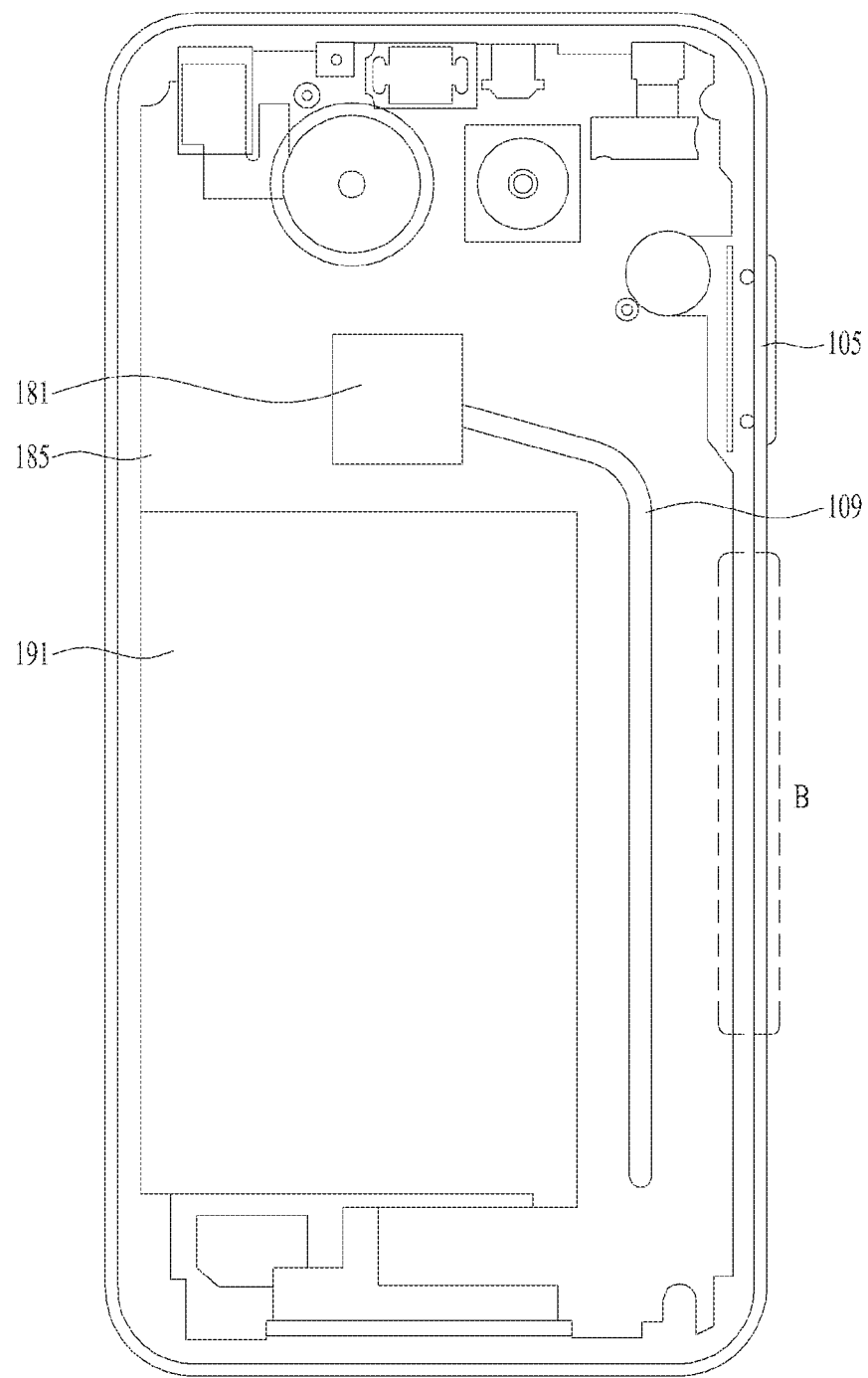
FIG. 12 is a diagram showing further example of a state that a front display unit of a mobile terminal related to the present invention is separated.
Figure 13:
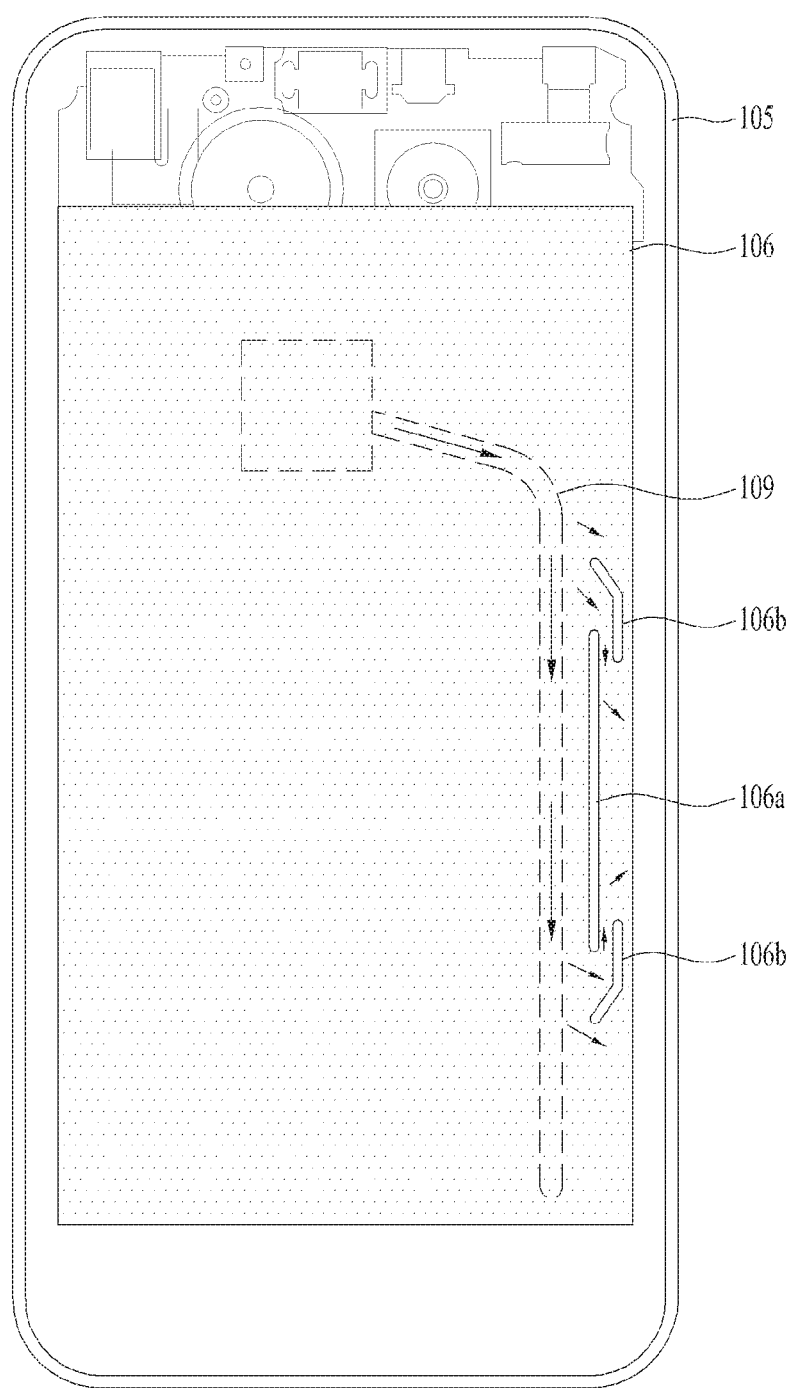
FIG. 13 is a diagram showing a display frame coupled over the mobile terminal shown in FIG. 12.

FIG. 12 is a diagram showing further example of a state that a front display unit 151 of a mobile terminal 100 related to the present invention is separated. FIG. 13 is a diagram showing a display frame 106 coupled over the mobile terminal shown in FIG. 12. Unlike the aforementioned embodiment, the mobile terminal 100 of the present embodiment is characterized in diffusing heat using a display frame 106 located between a display unit 151 and a main board 185.

The display frame 106 may be located on a backside of the display unit 151 so as to support the display unit 151, secure rigidity of the mobile terminal 100, and play a role as a ground. Since the display frame 106 is joined by covering the heating component 181 and the main board 185, although the heating component 181.

Yet, as hazard of explosion or the like due to heat may exist on the side of the battery 191, the heat pipe 109 is extended by avoiding a part of the battery 191. When a lateral case 105 of the mobile terminal 100 does not contain a metal material, there is no problem. Yet, when the lateral case 105 contains a metal material, if the heat pipe 109 is disposed adjacent to a lateral side of the case in a manner of being excessively spaced apart from the battery 191, there is a problem that heat is easily transferred to a part B of the lateral case 105.

In order to prevent heat from being transferred to the lateral case 105, a shield slit 106a and 106b may be formed on the display frame 106 seated on the structure shown in FIG. 12 [cf. FIG. 13]. The shield slit 106a and 106b prevents the heat, which is transferred to the display frame 106 through the heat pipe 109, from being directly transferred to the lateral case 105 made of the metallic material.

The shield slit 106a and 106b may include a first slit 106a disposed side by side with the lateral side and a second slit 106b disposed in a manner of overlapping with both end portions of the first slit 106a. The first slit 106a primarily prevents heat from being transferred to the lateral case, and the second slit 106b guides the flow of heat so that the heat can arrive to the lateral side as small as possible in a manner of diverting the heat transferred through the end portion of the first slit 106a. The second slit 106b may have a shape bend in a manner of enclosing the end portion of the first slit 106a.

As described above, durability of the mobile terminal 100 according to the present invention can be improved by enhancing heat dissipation performance of the mobile terminal 100. And, part increase can be minimized by utilizing a metal structure of the mobile terminal 100 itself as much as possible without sparing a space for a heat dissipation member additionally.

Moreover, use inconvenience due to heat generated from the mobile terminal 100 in use can be reduced by preventing heat from being transferred to a lateral side of the mobile terminal 100 most frequently touched by a hand of a user in case of using the mobile terminal.

As described above, while the present invention has been described and illustrated herein with reference to the preferred embodiments thereof, this description is intended to be illustrative, and not to limit the scope of the claims. Thus, it is intended that the present invention covers the modifications and variations of this invention provided they come within the scope of the appended claims and their equivalents.

What is claimed is:
1. A mobile terminal, comprising:
   a body including an internal space and a lateral metal case;
   a display unit mounted on a front side of the body;
   a main board located in the internal space and having a heating component mounted thereon;
   a heat pipe including a heat absorbing portion contacting the heating component and a heat transfer portion extending in a length direction of the body; and
   a battery installed in the internal space,
   wherein the heat transfer portion of the heat pipe is located between the battery and the lateral metal case,
   wherein a first distance between the battery and the heat transfer portion of the heat pipe is shorter than a second distance between the lateral metal case and the heat transfer portion of the heat pipe, and
   wherein the first distance and the second distance are measured in a width direction of the body that is perpendicular to the length direction of the body.
2. The mobile terminal of claim 1, further comprising:
   a display frame located on a backside of the display unit and contacting the heat pipe.
3. The mobile terminal of claim 2, further comprising:
   a shield slit formed on the display frame and extending in a top-bottom direction between the lateral metal case and the heat pipe.
4. The mobile terminal of claim 3, wherein the shield slit comprises a first slit and a second slit formed at a location spaced apart from both end portions of the first slit in a direction of the lateral metal case.

* * * * *